United States Patent
Xu et al.

(10) Patent No.: US 9,960,260 B2
(45) Date of Patent: May 1, 2018

(54) METAL OXIDE THIN FILM TRANSISTOR AND A PREPARATION METHOD THEREOF

(71) Applicant: GUANG ZHOU NEW VISION OPTO-ELECTRONIC TECHNOLOGY CO., LTD., Guangzhou, Guangdong (CN)

(72) Inventors: Miao Xu, Guangdong (CN); Dongxiang Luo, Guangdong (CN); Hongmeng Li, Guangdong (CN); Jiawei Pang, Guangdong (CN); Ying Guo, Guangdong (CN); Lang Wang, Guangdong (CN)

(73) Assignee: Guang Zhou New Vision Opto-Electronic Technology Co., Ltd., Guangzhou, Guangdong (CN)

( * ) Notice: Subject to any disclaimer, the term of this patent is extended or adjusted under 35 U.S.C. 154(b) by 0 days. days.

(21) Appl. No.: 14/890,641

(22) PCT Filed: Aug. 7, 2013

(86) PCT No.: PCT/CN2013/080937
§ 371 (c)(1),
(2) Date: Nov. 12, 2015

(87) PCT Pub. No.: WO2014/183340
PCT Pub. Date: Nov. 20, 2014

(65) Prior Publication Data
US 2016/0133729 A1  May 12, 2016

(30) Foreign Application Priority Data

May 14, 2013  (CN) .......................... 2013 1 0174837

(51) Int. Cl.
  *H01L 29/66*  (2006.01)
  *H01L 29/49*  (2006.01)
  (Continued)

(52) U.S. Cl.
CPC .. *H01L 29/66969* (2013.01); *H01L 29/42356* (2013.01); *H01L 29/42364* (2013.01);
(Continued)

(58) Field of Classification Search
CPC ............. H01L 29/786; H01L 29/78693; H01L 21/336; H01L 29/66; H01L 29/66742; H01L 29/7869
See application file for complete search history.

(56) References Cited

U.S. PATENT DOCUMENTS

| 2007/0139483 | A1* | 6/2007 | Katsumura | B41J 2/1433 347/68 |
| 2008/0283831 | A1* | 11/2008 | Ryu | H01L 29/7869 257/43 |
| 2013/0105797 | A1* | 5/2013 | Hayashi | H01L 29/66765 257/57 |

\* cited by examiner

*Primary Examiner* — Benjamin Sandvik
*Assistant Examiner* — Gustavo Ramallo
(74) *Attorney, Agent, or Firm* — Muncy, Geissler, Olds & Lowe, P.C.

(57) ABSTRACT

A Metal Oxide Thin Film Transistor (MOTFT) and a preparation method thereof are provided. The preparation method includes the following steps in turn: Step a: a metal conductive layer is prepared and patterned as a gate on a substrate; Step b: a first insulating thin film is deposited as a gate insulating layer on the metal conductive layer; Step c: a metal oxide thin film is deposited and patterned as an active layer on the gate insulating layer; Step d: an organic conductive thin film is deposited as a back channel etch protective layer on the active layer; Step e: a metal layer is deposited on the back channel etch protective layer and then patterned as pattern of a source electrode and a drain electrode; Step f: a second insulating thin film is deposited as a passivation layer on the source electrode and the drain electrode.

6 Claims, 4 Drawing Sheets

(51) Int. Cl.
*H01L 29/423* (2006.01)
*H01L 29/45* (2006.01)
*H01L 29/786* (2006.01)
(52) U.S. Cl.
CPC .. *H01L 29/42372* (2013.01); *H01L 29/42384* (2013.01); *H01L 29/45* (2013.01); *H01L 29/495* (2013.01); *H01L 29/4908* (2013.01); *H01L 29/7869* (2013.01); *H01L 29/78603* (2013.01)

METAL OXIDE THIN FILM TRANSISTOR AND A PREPARATION METHOD THEREOF

FIELD OF THE INVENTION

The present invention relates to the technical field of semiconductors, and particularly to a Metal Oxide Thin Film Transistor (MOTFT) and a preparation method thereof. The present invention is based on a Chinese patent application No. 201310174837.3 filed on May 14, 2013.

BACKGROUND OF THE INVENTION

In recent years, the industry of novel Flat Panel Display (FPD) has been developed dramatically, and a high demand of consumers for large-size and high resolution FPD is urging the whole industry to improve display technologies constantly. As a core technology of the PFD industry, the Thin Film Transistor (TFT) backplane technology is also experiencing a profound reform.

Because of a relatively low mobility (generally smaller than 0.5 cm$^2$/(V·s)), traditional amorphous silicon (a-Si) can hardly implement high definition display, and is facing the fate of being eliminated by the market. Although having a high mobility (50 to 150 cm$^2$/(V·s)), a Low Temperature Polycrystalline Silicon (LTPS) TFT is complicated in production techniques and expensive in equipment investment on one hand, and has problems including poor uniformity and low rate of good products in large-size display on the other hand, thereby resulting in difficult further development of LTPS in the field of large size FPD. In contrast, an MOTFT not only has a relatively high mobility (about 5 to 50 cm$^2$/(V·s)), but also is prepared with simple techniques and low manufacture cost, and has excellent uniformity in a large area. Therefore, the MOTFT technology has attracted great attention in the industry since its emergence.

At present, an MOTFT mainly uses a back channel etch structure and an etch barrier layer structure. The back channel etch structure is formed by depositing a metal layer and patterning the metal layer as a source electrode and a drain electrode on an active layer after the active layer is generated while the etch barrier layer structure is formed by depositing a metal layer and patterning the metal layer as a source electrode and a drain electrode on an etch barrier layer which is manufactured first after an active layer is generated.

The back channel etch structure is manufactured with a relatively simple technique, and what is the same as a traditional a-Si manufacture technique is that the equipment investment and production cost are relatively low. The structure is believed to be an inevitable development direction of mass production and wide application of MOTFTs. However, a back channel may be damaged no matter dry etching or wet etching is applied when the source electrode and the drain electrode are etched on the active layer: when drying etching is applied, a metal oxide is easily damaged by ions, which generates a carrier bulk trap on the exposed channel surface and increases the oxygen vacancy concentration to lower the device stability; when the wet etching is applied, the active layer, which is sensitive to most acid etchants, is easily etched during an etching process, thereby greatly affecting the device performance. Currently, an MOTFT having the structure can be hardly productized.

An MOTFT using the etch barrier layer structure can avoid the foregoing problem to a large extent, thus the MOTFT is more stable. A TFT using the structure has been commercialized at present. However, the TFT requires an additional photoetching mask to manufacture the etch barrier layer, which results in complicated techniques and high manufacture cost.

Therefore, it is necessary to provide an MOTFT with good stability, simple preparation techniques and low cost and a preparation process thereof so as to overcome disadvantages of the prior art.

SUMMARY OF THE INVENTION

One of the purposes of the present invention is to provide a preparation method of an MOTFT. The preparation method has features of a simple manufacture process, low cost, and high stability of the prepared MOTFT. The present invention simultaneously provides an MOTFT prepared by the method.

The above purpose of the present invention is implemented by the following technical means.

A preparation method of an MOTFT, wherein the preparation method includes the following steps in turn: Step a: a metal conductive layer is prepared and patterned as a gate on a substrate;

Step b: a first insulating thin film is deposited as a gate insulating layer on the metal conductive layer;

Step c: a metal oxide thin film is deposited and patterned as an active layer on the gate insulating layer;

Step d: an organic conductive thin film is deposited as a back channel etch protective layer on the active layer;

Step e: a metal layer is deposited on the back channel etch protective layer and then patterned as pattern of a source electrode and a drain electrode;

Step f: a second insulating thin film is deposited as a passivation layer on the source electrode and the drain electrode.

The thickness of the back channel etch protective layer is set as 1 to 50 nm.

The organic conductive thin film is specifically formed by depositing an organic material including fullerene (C$_{60}$), a fullerene derivative [6,6]-phenyl-C$_{61}$-butyric acid methyl ester (PCBM), a carbon nano tube, grapheme or poly(3,4-ethylenedioxythiophene) polystyrene sulfonate (PEDOT: PSS), aluminum tris-hydroxyquinoline (Alq$_3$) and so on in the Step d.

A film-forming method of the back channel etch protective layer is a spin coating method, or a vacuum thermal evaporation method, or silk screen printing or film forming using an ink-jet printing method.

Preferably, the substrate in the Step a is set as a glass substrate having a buffer layer or a flexible substrate having a vapour and oxygen barrier layer;

when the substrate is the flexible substrate, the flexible substrate is specifically set as a polyethylene naphthalate (PEN) flexible substrate, a polyethylene terephthalate (PET) flexible substrate, a polyimide (PI) flexible substrate or a metal foil flexible substrate.

Preferably, a metal used for preparing and patterning the metal conductive layer on the substrate in the Step a is an elementary substance of aluminum, copper, molybdenum, titanium, silver, gold, tantalum, tungsten, or chromium or an aluminum alloy;

the thickness of the metal conductive layer is set as 100 nm to 2000 nm;

the metal conductive layer functions as the gate of the MOTFT.

Preferably, the thickness of the first insulating thin film in the Step b is 50 nm to 500 nm;

the first insulating thin film is a single layer thin film of a silicon oxide, silicon nitride, aluminum oxide, tantalum pentoxide or ytterbium oxide insulating thin film or a thin film having more than one layer formed by any combination of the materials above;

the thickness of the active layer in the Step c is 20 nm to 200 nm;

a semiconductor material forming the active layer is a metal oxide $(In_2O_3)_x(MO)_y(ZnO)_z$, where $0 \leq x \leq 1$, $0 \leq y \leq 1$, $0 \leq z \leq 1$, and $x+y+z=1$; M is one or any combination of more than one of a gallium, tin, silicon, aluminum, magnesium, tantalum, chromium, ytterbium, nickel, zirconium and lanthanum series rare earth element.

Preferably, a metal used for depositing the metal layer in the Step e is an elementary substance of aluminum, copper, molybdenum, and titanium, or an alloy material using the metal elementary substances above as a main part;

the metal layer is a single layer aluminum thin film, copper thin film, molybdenum thin film, and titanium thin film, or an alloy material film using the metal elementary substances above as a main part, or a thin film having more than one layer formed by the single layer metal thin films above;

the thickness of the metal layer is 100 nm to 2000 nm.

Preferably, the thickness of the passivation layer is 50 nm to 2000 nm;

the passivation layer is a single layer thin film of silicon oxide, silicon nitride, aluminum oxide, ytterbium oxide, PI, photoresist, benzocyclobutene or polymethyl methacrylate or a thin film having more than one layer formed by any combination of the materials above.

A preparation method of an MOTFT of the present invention includes the following steps in turn: Step a: a metal conductive layer is prepared and patterned as a gate on a substrate; Step b: a first insulating thin film is deposited as a gate insulating layer on the metal conductive layer; Step c: a metal oxide thin film is deposited and patterned as an active layer on the gate insulating layer; Step d: an organic conductive thin film is deposited as a back channel etch protective layer on the active layer; Step e: a metal layer is deposited on the back channel etch protective layer and then patterned as pattern of a source electrode and a drain electrode; Step f: a second insulating thin film is deposited as a passivation layer on the source electrode and the drain electrode. The present invention introduces an organic back channel etch protective layer based on a back channel etch type MOTFT. The organic back channel etch protective layer can greatly reduce damage to a back channel of the MOTFT during the etching process of the source electrode and the drain electrode. Thus, the MOTFT prepared by the method of the present invention has high stability, and the method of the present invention is simple in techniques and low in cost.

An MOTFT provided by the present invention is prepared by using the method above. The stability of the prepared MOTFT is largely improved, thereby satisfying a requirement of productization of the MOTFT. Besides, the preparation technique is simple and the cost is low.

BRIEF DESCRIPTION OF THE DRAWINGS

The present invention is further described by the accompanying drawings. However, the content in the accompanying drawings does not constitute any limitation to the present invention.

DETAILED DESCRIPTION OF THE PREFERRED EMBODIMENTS

Figure 1:
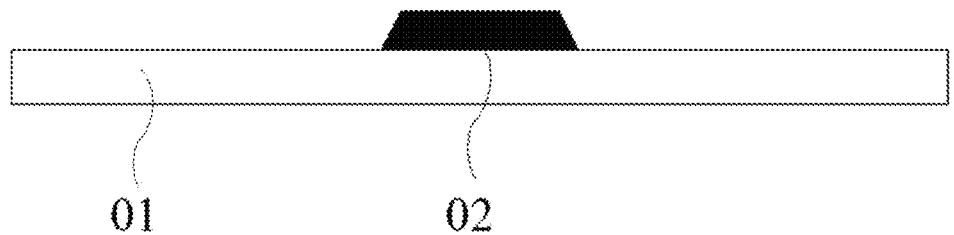
FIG. 1 is a schematic diagram of depositing and patterning a metal conductive layer as a gate according to an embodiment of the present invention.

The present invention will be further described in combination with the following embodiments.

Embodiment 1

A preparation method of an MOTFT, including the following steps in turn:

Step a: A metal conductive layer is prepared and patterned as a gate on a substrate.

Specifically, the substrate in the Step a is set as a glass substrate having a buffer layer or a flexible substrate having a vapour and oxygen barrier layer.

When the substrate is the flexible substrate, the flexible substrate is specifically set as a PEN flexible substrate, a PET flexible substrate, a PI flexible substrate or a metal foil flexible substrate.

A metal used for preparing and patterning the metal conductive layer on the substrate in the Step a is an elementary substance of aluminum, copper, molybdenum, titanium, silver, gold, tantalum, tungsten, or chromium or an aluminum alloy.

The thickness of the metal conductive layer is set as 100 nm to 2000 nm. The metal conductive layer functions as the gate of the MOTFT and may be specifically a single layer aluminum thin film, copper thin film, molybdenum thin film, titanium thin film, silver thin film, gold thin film, tantalum thin film, tungsten thin film, or chromium thin film or an aluminum alloy thin film, or a thin film having more than one layer formed by the single layer metal thin films above.

Step b is performed after the metal conductive layer is manufactured.

Step b: A first insulating thin film is deposited as a gate insulating layer on the metal conductive layer.

Specifically, the thickness of the first insulating thin film in the Step b is 50 nm to 500 nm.

The first insulating thin film is a single layer thin film of a silicon oxide, silicon nitride, aluminum oxide, tantalum pentoxide or ytterbium oxide insulating thin film or a thin film having more than one layer formed by any combination of the materials above.

Step c: A metal oxide thin film is deposited and patterned as an active layer on the gate insulating layer.

Specifically, the thickness of the active layer in the Step c is 20 nm to 200 nm. A semiconductor material forming the active layer is a metal oxide $(In_2O_3)_x(MO)_y(ZnO)_z$, where $0 \leq x \leq 1$, $0 \leq y \leq 1$, $0 \leq z \leq 1$, and $x+y+z=1$; M is one or any combination of more than one of a gallium, tin, silicon, aluminum, magnesium, tantalum, chromium, ytterbium, nickel, zirconium and lanthanum series rare earth element.

Step d: An organic conductive thin film is deposited as a back channel etch protective layer on the active layer.

The organic conductive thin film is specifically formed by depositing an organic material including fullerene ($C_{60}$), a fullerene derivative PCBM, a carbon nano tube, grapheme or PEDOT:PSS, $Alq_3$ and so on in the Step d. The thickness of the back channel etch protective layer is set as 1 to 50 nm and a film-forming method of the back channel etch protective layer is a spin coating method, or a vacuum thermal evaporation method, or silk screen printing or film forming using an ink-jet printing method.

Step e: A metal layer is deposited on the back channel etch protective layer and then patterned as pattern of a source electrode and a drain electrode.

Specifically, a metal used for depositing the metal layer in the Step e is an elementary substance of aluminum, copper, molybdenum, and titanium, or an alloy material using the metal elementary substances above as a main part. The metal layer is a single layer aluminum thin film, copper thin film, molybdenum thin film, and titanium thin film, or an alloy material film using the metal elementary substances above as a main part, or a thin film having more than one layer formed by the single layer metal thin films above. The thickness of the metal conductive layer is 100 nm to 2000 nm. Step f is performed finally.

Step f: A second insulating thin film is deposited as a passivation layer on the source electrode and the drain electrode.

The thickness of the passivation layer is 50 nm to 2000 nm. The passivation layer is a single layer thin film of silicon oxide, silicon nitride, aluminum oxide, ytterbium oxide, PI, photoresist, benzocyclobutene or polymethyl methacrylate or a thin film having more than one layer formed by any combination of the materials above.

The present invention introduces an organic back channel etch protective layer based on a back channel etch type MOTFT. The organic back channel etch protective layer can greatly reduce damage to a back channel of the MOTFT during the etching process of the source electrode and the drain electrode. Thus, the MOTFT prepared by the method of the present invention has high stability, and the method of the present invention is simple in techniques and low in cost. The prepared MOTFT also has features including high stability, simple preparation techniques and low cost.

Embodiment 2

A preparation method of an MOTFT includes the following process.

As shown in FIG. 1, an Mo/Al/Mo three-layer metal thin film is deposited as a metal conductive layer on an alkali-free glass substrate 01 with a 200 nm thick $SiO_2$ buffer layer by using a Physical Vapor Deposition (PVD) method, and the thicknesses of Mo/Al/Mo are 25 nm/100 nm/25 nm respectively. The metal conductive layer is patterned as a gate 02 by using a photolithographic process.

It needs to be noted that the thickness of the metal conductive layer is in a range of 100 nm to 2000 nm. A specific size of the metal conductive layer may be set flexibly according to a practical need, and is not limited to the size in the present embodiment. A material forming the metal conductive layer is also not limited by the situation in the present embodiment.

Figure 2:
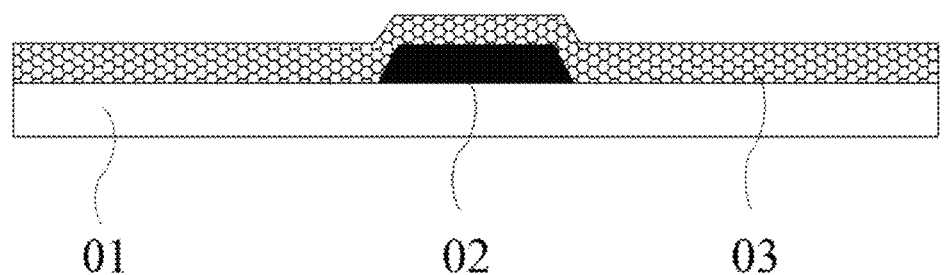
FIG. 2 is a schematic diagram of depositing a first insulating film as a gate insulating layer on a metal conductive layer according to an embodiment of the present invention.

Subsequently, as shown in FIG. 2, a first insulating film 03 is deposited on the patterned metal conductive layer by using a Plasma Enhanced Chemical Vapor Deposition (PECVD) method. The first insulating film 03 is laminated by 300 nm of $SiN_x$ and 30 nm of $SiO_2$ as a gate insulating layer. It needs to be noted that the thickness of the first insulating film is in a range of 50 nm to 500 nm. A size of the first insulating film may be set flexibly according to a practical need, and is not limited to the size in the present embodiment. A material forming the first insulating film is also not limited by the situation in the present embodiment.

Figure 3:
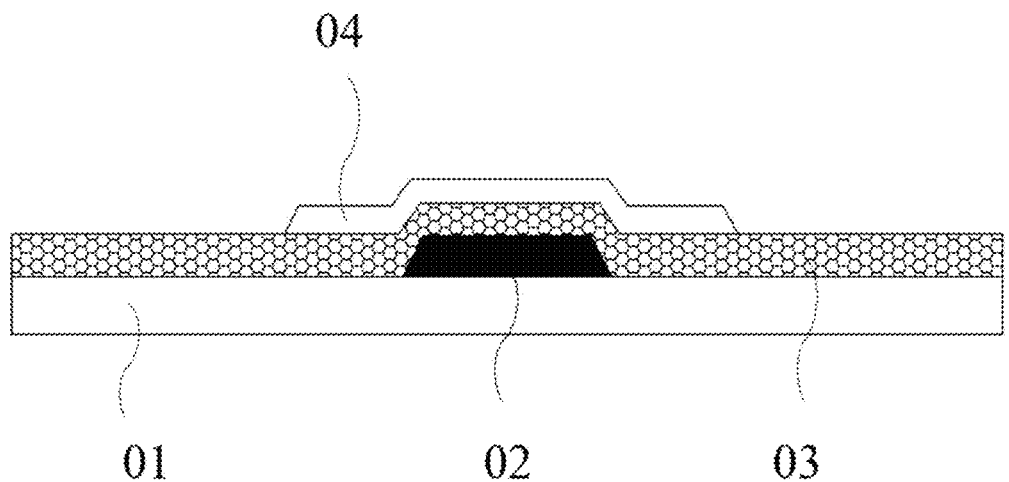
FIG. 3 is a schematic diagram of depositing an active layer according to an embodiment of the present invention.

Subsequently, 50 nm of a metal oxide IZO thin film (the atomic ratio of In to Zn is 1:1) is deposited as an active layer 04 by using the PVD method, as shown in FIG. 3.

It needs to be noted that the thickness of the active layer is in a range of 20 nm to 200 nm. A size of the active layer may be set flexibly according to a practical need, and is not limited to the size in the present embodiment. A material forming the active layer is also not limited by the situation in the present embodiment.

Figure 4:
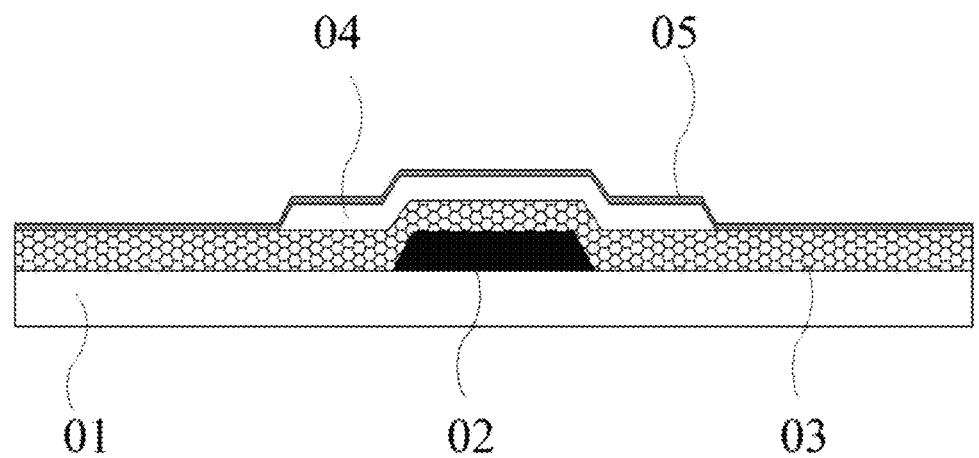
FIG. 4 is a schematic diagram of depositing an organic conductive film as a back channel etch protective layer according to an embodiment of the present invention.

As shown in FIG. 4, 30 nm of PCBM is manufactured as an organic back channel etch protective layer 05 by using a spin coating method. Here, the back channel etch protective layer 05 is manufactured and the protective layer can reduce damage on a back channel of the MOTFT during an etching process of a source electrode and a drain electrode.

It needs to be noted that, the thickness of the back channel etch protective layer is in a range of 1 nm to 50 nm. A size of the back channel etch protective layer may be set flexibly according to a practical need, and is not limited to the size in the present embodiment. A material forming the back channel etch protective layer is also not limited by the situation in the present embodiment.

Figure 5:
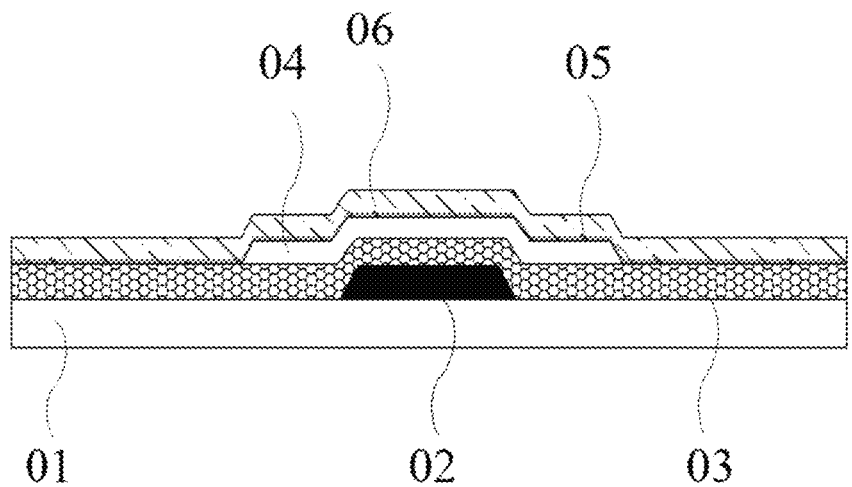
FIG. 5 is a schematic diagram of depositing a metal layer on a back channel etch protective layer according to an embodiment of the present invention.
Figure 6:
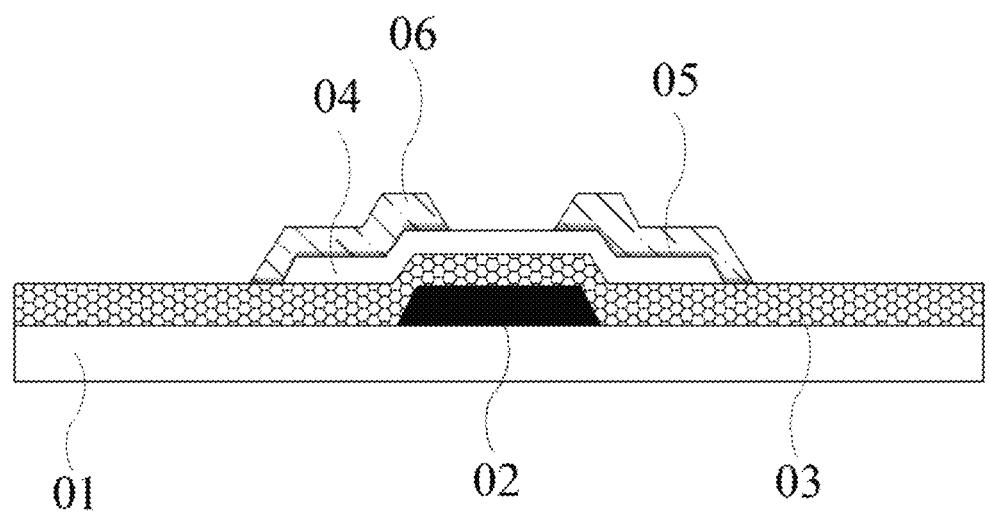
FIG. 6 is a schematic diagram of patterning a source electrode and a drain electrode according to an embodiment of the present invention.

As shown in FIG. 5, an Mo/Al/Mo laminated metal layer is prepared on the back channel etch protective layer by using the PVD method, and the thicknesses of Mo, Al and Mo are 25 nm/100 nm/25 nm, respectively. $H_2O_2$ having a concentration of 30% and KOH having a concentration of 1% are used as wet etching liquids to etch the Mo and Al in the laminated metal layer, respectively. The Mo, Al and Mo are patterned to form a metal layer 06 of the source electrode and the drain electrode by using the method, as shown in FIG. 6.

Figure 7:
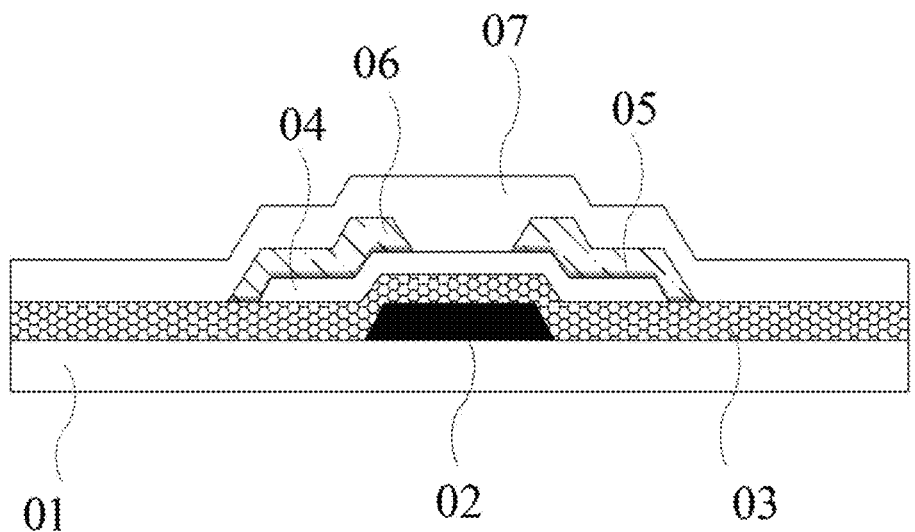
FIG. 7 is a schematic diagram of manufacturing a passivation layer according to an embodiment of the present invention.

Finally, as shown in FIG. 7, $SiO_2$ is deposited in a thickness of 300 nm as a passivation layer 07 by using the PECVD method to finish the manufacture of the MOTFT. According to the preparation method of the present method, the structure of the MOTFT is a bottom gate and back channel etching structure. The structure of the organic back channel etch protective layer is manufactured during the process of etching the source electrode and the drain electrode on the back channel. The back channel etch protective layer can reduce damage on the MOTFT during the process of etching the source electrode and the drain electrode. It has been proven by a lot of practice that the MOTFT prepared by the preparation method of the present invention is highly stable and has features including simple preparation techniques, low cost and so on, and a driving backplane of the MOTFT can be manufactured with high precision and low cost.

The MOFTF manufactured by the process may be applied in the fields of Liquid Crystal Displays (LCD) and Active Matrix Organic Light Emitting Diodes (AMOLED).

It needs to be noted that the sizes and proportions involved in the present embodiment do not limit a preparation process of an MOTFT of the present invention, and a user may make adjustment flexibly according to a specific need during a practical preparation process.

Embodiment 3

A preparation method of an MOTFT includes the following process.

As shown in FIG. 1, a 500 nm thick Cu film is deposited as a metal conductive layer on a substrate 01 of a flexible PET thin film with 50 nm of an $Al_2O_3$ vapour and oxygen barrier layer by using a PVD method. The metal conductive layer is patterned as a gate 02 by using a photolithographic process.

It needs to be noted that the thickness of the metal conductive layer is in a range of 100 nm to 2000 nm. A specific size of the metal conductive layer may be set flexibly according to a practical need, and is not limited to the size in the present embodiment. A material forming the metal conductive layer is also not limited by the situation in the present embodiment.

Subsequently, as shown in FIG. 2, a first insulating film 03 is deposited on the patterned metal conductive layer by using a PECVD method. The first insulating film 03 is laminated by 200 nm of aluminium oxide and 100 nm of ytterbium oxide as a gate insulating layer. It needs to be noted that the thickness of the first insulating film is in a range of 50 nm to 500 nm. A size of the first insulating film may be set flexibly according to a practical need, and is not limited to the size in the present embodiment. A material forming the first insulating film is also not limited by the situation in the present embodiment.

Subsequently, 50 nm of a metal oxide IGZO thin film (the atomic ratio of In to Ga to Zn is 1:1:1) is deposited as an active layer 04 by using the PVD method, as shown in FIG. 3.

It needs to be noted that the thickness of the active layer is in a range of 20 nm to 200 nm. A size of the active layer may be set flexibly according to a practical need, and is not limited to the size in the present embodiment. A material forming the active layer is also not limited by the situation in the present embodiment.

As shown in FIG. 4, 3 nm of $Alq_3$ is manufactured as an organic back channel etch protective layer 05 by using a thermal evaporation method. Here, the back channel etch protective layer 05 is manufactured and the protective layer can reduce damage on a back channel of the MOTFT during an etching process of a source electrode and a drain electrode.

It needs to be noted that, the thickness of the back channel etch protective layer is in a range of 1 nm to 50 nm. A size of the back channel etch protective layer may be set flexibly according to a practical need, and is not limited to the size in the present embodiment. A material forming the back channel etch protective layer is also not limited by the situation in the present embodiment.

As shown in FIG. 5, an Mo/Cu laminated metal layer is prepared on the back channel etch protective layer by using the PVD method, and the thicknesses of Mo and Cu are 25 nm and 2000 nm, respectively. $H_2O_2$ having a concentration of 30% and $FeCl_3$ are used as wet etching liquids to etch the Mo and Cu in the laminated metal layer, respectively. The Mo and Cu are patterned to form a metal layer 06 of the source electrode and the drain electrode by using the method, as shown in FIG. 6.

Finally, as shown in FIG. 7, PI is deposited in a thickness of 800 nm as a passivation layer 07 by using the PECVD method to finish the manufacture of the MOTFT.

According to the preparation method of the present method, the structure of the MOTFT is a bottom gate and back channel etching structure. The structure of the organic back channel etch protective layer is manufactured during the process of etching the source electrode and the drain electrode on the back channel. The back channel etch protective layer can reduce damage on the MOTFT during the process of etching the source electrode and the drain electrode. It has been proven by a lot of practice that the MOTFT prepared by the preparation method of the present invention is highly stable and has features including simple preparation techniques, low cost and so on, and a driving backplane of the MOTFT can be manufactured with high precision and low cost.

The MOFTF manufactured by the process may be applied in the fields of LCDs and AMOLEDs.

It needs to be noted that the sizes and proportions involved in the present embodiment do not limit a preparation process of an MOTFT of the present invention, and a user may make adjustment flexibly according to a specific need during a practical preparation process.

Embodiment 4

A preparation method of an MOTFT includes the following process.

As shown in FIG. 1, a 200 nm thick ITO thin film is deposited as a metal conductive layer on a substrate 01 of a flexible PET thin film with 200 nm of a $Si_3O_4$ vapour and oxygen barrier layer by using a PVD method. The metal conductive layer is patterned as a gate 02 by using a photolithographic process.

It needs to be noted that the thickness of the metal conductive layer is in a range of 100 nm to 2000 nm. A specific size of the metal conductive layer may be set flexibly according to a practical need, and is not limited to the size in the present embodiment. A material forming the metal conductive layer is also not limited by the situation in the present embodiment.

Subsequently, as shown in FIG. 2, a first insulating film 03 is deposited on the patterned metal conductive layer by using a PECVD method. The first insulating film 03 is laminated by 100 nm of silicon nitride, 90 nm of tantalum pentoxide and 20 nm of silicon dioxide as a gate insulating layer. It needs to be noted that the thickness of the first insulating film is in a range of 50 nm to 500 nm. A size of the first insulating film may be set flexibly according to a practical need, and is not limited to the size in the present embodiment. A material forming the first insulating film is also not limited by the situation in the present embodiment.

Subsequently, 50 nm of a metal oxide IZO thin film (the atomic ratio of In to Zn is 1:1) is deposited as an active layer 04 by using the PVD method, as shown in FIG. 3.

It needs to be noted that the thickness of the active layer is in a range of 20 nm to 200 nm. A size of the active layer may be set flexibly according to a practical need, and is not limited to the size in the present embodiment. A material forming the active layer is also not limited by the situation in the present embodiment.

As shown in FIG. 4, 50 nm of PEDOT:PSS is manufactured as an organic back channel etch protective layer 05 by using a silk screen printing method. Here, the back channel etch protective layer 05 is manufactured and the protective layer can reduce damage on a back channel of the MOTFT during an etching process of a source electrode and a drain electrode.

It needs to be noted that, the thickness of the back channel etch protective layer is in a range of 1 nm to 50 nm. A size of the back channel etch protective layer may be set flexibly according to a practical need, and is not limited to the size in the present embodiment. A material forming the back channel etch protective layer is also not limited by the situation in the present embodiment.

As shown in FIG. 5, a Mo single layer metal layer is prepared on the back channel etch protective layer by using the PVD method, and the thicknesses of the Mo single layer metal layer is 200 nm. The Mo is subjected to dry etching by using a reactive ion etching device. $SF_6/O_2$ having a flow ratio of 50 sccm:10 sccm is used as a reactive gas to etch the Mo in the metal layer. The Mo is patterned to form a metal layer 06 of the source electrode and the drain electrode by using the method, as shown in FIG. 6.

Finally, as shown in FIG. 7, $SiO_2$ is deposited in a thickness of 300 nm as a passivation layer 07 by using the PECVD method to finish the manufacture of the MOTFT.

According to the preparation method of the present method, the structure of the MOTFT is a bottom gate and back channel etching structure. The structure of the organic back channel etch protective layer is manufactured during the process of etching the source electrode and the drain electrode on the back channel. The back channel etch protective layer can reduce damage on the MOTFT during the process of etching the source electrode and the drain electrode. It has been proven by a lot of practice that the MOTFT prepared by the preparation method of the present invention is highly stable and has features including simple preparation techniques, low cost and so on, and a driving backplane of the MOTFT can be manufactured with high precision and low cost.

The MOFTF manufactured by the process may be applied in the fields of LCDs and AMOLEDs.

It needs to be noted that the sizes and proportions involved in the present embodiment do not limit a preparation process of an MOTFT of the present invention, and a user may make adjustment flexibly according to a specific need during a practical preparation process.

Embodiment 5

A MOTFT is prepared according to any method in the first embodiment to the fourth embodiment. The MOTFT of the present invention is highly stable and has features including simple preparation techniques, low cost and so on, and a driving backplane of the MOTFT can be manufactured with high precision and low cost.

The MOFTF manufactured by the process may be applied in the fields of LCDs and AMOLEDs.

Finally, it should be noted that the embodiments above are only used for describing the technical solutions of the present invention, but are not intended to limit the protection scope of the present invention. Although the present invention has been described in details with reference to preferred embodiments, those of ordinary skill in the art should understand that modifications and equivalent replacements may be made to the technical solutions of the present invention without departing from the essence and scope of the technical solution of the present invention.

INDUSTRIAL APPLICABILITY

The present invention introduces an organic back channel etch protective layer based on a back channel etch type MOTFT. The organic back channel etch protective layer can greatly reduce damage to a back channel of an MOTFT during an etching process of a source electrode and a drain electrode. Thus, the MOTFT prepared by a method of the present invention is highly stable, and the process is simple in techniques and low in cost, has good industrial applicability.

What is claimed is:

1. A preparation method of a Metal Oxide Thin Film Transistor (MOTFT), comprising the following steps in turn:
   Step a: a metal conductive layer is prepared and patterned as a gate on a substrate;
   Step b: a first insulating thin film is deposited as a gate insulating layer on the metal conductive layer;
   Step c: a metal oxide thin film is deposited and patterned as an active layer on the gate insulating layer;
   Step d: an electrically conductive organic thin film is deposited as a back channel etch protective layer on the active layer, wherein the thickness of the back channel etch protective layer is set as 1 to 50 nm; the organic conductive thin film is specifically formed by depositing an organic material including fullerene ($C_{60}$), a fullerene derivative [6,6]-phenyl-$C_{61}$-butyric acid methyl ester (PCBM), a carbon nano tube, poly(3,4-ethylenedioxythiophene) polystyrene sulfonate (PE-DOT:PSS), or aluminium tris-hydroxyguinoline ($Alq_3$); a film-foiniing method of the back channel etch protective layer is a spin coating method, or a vacuum thermal evaporation method, or silk screen printing or film forming using an ink-jet printing method;
   Step e: a metal layer is deposited on the back channel etch protective layer and then patterned as pattern of a source electrode and a drain electrode whereby the electrically conductive organic thin film between the source and drain electrodes is removed; and
   Step f: a second insulating thin film is deposited as a passivation layer on the source electrode and the drain electrode.

2. The preparation method of the MOTFT according to claim 1, wherein the substrate in the Step a is set as a glass substrate having a buffer layer or a flexible substrate having a vapour and oxygen barrier layer;
   when the substrate is the flexible substrate, the flexible substrate is specifically set as a polyethylene naphthalate (PEN) flexible substrate, a polyethylene terephthalate (PET) flexible substrate, a polyimide (PI) flexible substrate or a metal foil flexible substrate.

3. The preparation method of the MOTFT according to claim 1, wherein a metal used for preparing and patterning the metal conductive layer on the substrate in the Step a is an elementary substance of aluminum, copper, molybdenum, titanium, silver, gold, tantalum, tungsten, or chromium or an aluminum alloy;
   the metal conductive layer is a single layer aluminum thin film, copper thin film, molybdenum thin film, titanium thin film, silver thin film, gold thin film, tantalum thin film, tungsten thin film, or chromium thin film or an aluminum alloy thin film, or a thin film having more than one layer formed by the single layer metal thin films above;
   the thickness of the metal conductive layer is set as 100 nm to 2000 nm; the metal conductive layer functions as the gate of the MOTFT.

4. The preparation method of the MOTFT according to claim 1, wherein the thickness of the first insulating thin film in the Step b is 50 nm to 500 nm;
   the first insulating thin film is a single layer thin film of a silicon oxide, silicon nitride, aluminum oxide, tantalum pentoxide or ytterbium oxide insulating thin film or a thin film having more than one layer fomied by any combination of the materials above;
   the thickness of the active layer in the Step c is 20 nm to 200 nm; a semiconductor material forming the active layer is a metal oxide $(In_2O_3)_x(MO)_y(ZnO)_z$, where $0 \leq x \leq 1$, $0 \leq y \leq 1$, $0 \leq z \leq 1$, and $x+y+z=1$; M is one or any combination of more than one of a gallium, tin, silicon, aluminum, magnesium, tantalum, chromium, ytterbium, nickel, zirconium and lanthanum series rare earth element.

5. The preparation method of the MOTFT according to claim 1, wherein a metal used for depositing the metal layer in the Step e is an elementary substance of aluminum, copper, molybdenum, and titanium, or an alloy material using the metal elementary substances above as a main part;

the metal layer is a single layer aluminum thin film, copper thin film, molybdenum thin film, and titanium thin film, or an alloy material film using the metal elementary substances above as a main part, or a thin film having more than one layer formed by the single layer metal thin films above;

the thickness of the metal layer is 100 nm to 2000 nm.

6. The preparation method of the MOTFT according to claim 1, wherein the thickness of the passivation layer is 50 nm to 2000 nm;

the passivation layer is a single layer thin film of silicon oxide, silicon nitride, aluminum oxide, ytterbium oxide, PI, photoresist, benzocyclobutene or polymethyl methacrylate or a thin film having more than one layer formed by any combination of the materials above.

\* \* \* \* \*